United States Patent [19]

Birleson

[11] Patent Number: 5,630,221

[45] Date of Patent: May 13, 1997

[54] DYNAMIC RANGE EXTENSION SYSTEM

[75] Inventor: Stanley V. Birleson, Rowlett, Tex.

[73] Assignee: Texas Instruments Incorporated, Dallas, Tex.

[21] Appl. No.: 482,062

[22] Filed: Jun. 7, 1995

Related U.S. Application Data

[63] Continuation of Ser. No. 809,366, Dec. 18, 1991, abandoned.

[51] Int. Cl.$^6$ .................................................. H04B 1/16
[52] U.S. Cl. .............................. 455/249.1; 455/250.1; 455/251.1; 341/139; 342/91
[58] Field of Search ...................... 455/234.1, 234.2, 455/235.1, 245.1, 245.2, 249.1, 250.1, 251.1; 341/139, 140; 375/26, 98; 342/89, 91, 92; 330/284

[56] References Cited

U.S. PATENT DOCUMENTS

| | | | |
|---|---|---|---|
| 3,573,804 | 4/1971 | Picou | 341/139 |
| 3,613,111 | 10/1971 | Paine | 341/139 |
| 4,191,995 | 3/1980 | Farrow | 364/113 |
| 4,270,222 | 5/1981 | Menant | 455/249.1 |
| 4,553,105 | 11/1985 | Sasaki | 455/249.1 |
| 4,625,240 | 11/1986 | Yablonski et al. | 375/98 |
| 4,674,062 | 6/1987 | Premerlani | 341/139 |
| 4,851,842 | 7/1989 | Iwamatsu | 341/139 |
| 4,989,074 | 1/1991 | Matsumoto | 455/234.1 |
| 5,050,192 | 9/1991 | Nawata | 455/249.1 |
| 5,075,687 | 12/1991 | Chen et al. | 341/139 |
| 5,101,205 | 3/1992 | Yasuda | 375/26 |
| 5,101,210 | 3/1992 | Milan | 342/91 |
| 5,146,155 | 9/1992 | Trinh Van et al. | 341/139 |
| 5,175,882 | 12/1992 | Higashijima | 455/234.1 |

*Primary Examiner*—Edward F. Urban
*Attorney, Agent, or Firm*—René E. Grossman; Richard L. Donaldson

[57] ABSTRACT

Receiver dynamic range is improved while maintaining system processing fidelity by placing a processor control attenuator in front of the synchronous detector or other circuitry and A/D converter circuits. This is followed by a digital circuit which reinserts the attenuation that was taken out previously to maintain signal processing fidelity. The control for the attenuator function is from the processor and is determined by looking at the prior pulse repetition intervals (PRIs) of the radar system data and determining from that data what attenuator value to use for the next PRI. This is done for each range bin to be processed.

18 Claims, 1 Drawing Sheet

DYNAMIC RANGE EXTENSION SYSTEM

This is a continuation of application Ser. No. 07/809,366 filed on Dec. 18, 1991 now abandoned.

BACKGROUND OF THE INVENTION

1. Field of the Invention

This invention relates to a circuit for improving the dynamic range of a receiver while maintaining system processing fidelity.

2. Background and Brief Description of the Prior Art

Air-to-air radars have historically required a large receive dynamic range, especially in the look down mode. In the look down mode of operation, the radar receives a large back scatter from the terrain under investigation while looking for airborne targets with relatively small radar cross sections. With the next generation low observable targets, this problem will be magnified greatly.

In recent years, the dynamic range and sampling rate of analog-to-digital (A/D) converters have increased. However, though the dynamic range requirement has increased at an even greater rate than the sampling rate, there is still a need for greatly improved dynamic range. Spur free dynamic ranges of A/D converters operating in the 5 to 10 MHz sampling rate regime are typically 65 dB with the state of the art devices reaching about 85 dB. Projected system needs exceed these numbers and require spur free dynamic ranges in excess of 100 dB. The problem is further magnified due to the variation in the terrain that the radar sees. Often the radar designer uses a margin known as "operating head room" at the A/D converter which is on the order of about 15 dB. This allows clutter fluctuations to increase up to the head room value, about 15 dB, without the A/D converter saturating. Therefore, if the A/D converter has a total spur free dynamic range of 85 dB and one must operate 15 dB below that point nominally, this leaves only 70 dB usable dynamic range for most A/D designs. The A/D converter "head room" is a very important parameter in air-to-air radar design because, when a return signal does saturate in the A/D converter, it will degrade the spur free dynamic range by many tens of dBs and literally destroy the value of that coherent processing interval. The purpose of this invention is to greatly minimize the need for the A/D converter head room requirement and avoid A/D saturation while maintaining signal processing fidelity.

SUMMARY OF THE INVENTION

In accordance with the present invention, receiver dynamic range is improved while maintaining system processing fidelity. This is accomplished by placing a processor controlled attenuator ahead of the synchronous detector and A/D converter circuits. This is followed by a digital circuit which reinserts the attenuation that was taken out previously to maintain signal processing fidelity. The control for the attenuator function is from the processor and is determined by looking at the prior pulse repetition intervals (PRIs) (the time between pulses from the radar) of the radar system data and determining from that data what attenuation value to use at the attenuators for the next PRI. This operation is repeated for each range bin to be processed.

More specifically, the dynamic range system must first include an A/D converter with a maximum spur free dynamic range that meets system requirements. Then an attenuation function is placed on in the receiver and on the digital side of the A/D converter, these being an attenuator function in analog form in the receiver of the A/D converter and an attenuation function in digital form after the A/D converter. The digital attenuator provides an attenuation function that is the inverse of the attenuation function applied at the analog attenuator positioned ahead of the A/D converter so that the combined attenuation is at a level of about 1 to restore the original dynamic level. There is also a data file which is used to determine the values of attenuation for the PRI for each range bin (every sample out of the A/D converter for a particular PRI can be considered a range bin). This file is composed of the attenuation applied for each range bin during the last PRI plus an error term for each range bin. This then provides the attenuation value to use for the current setting of the attenuators.

The system takes advantage of the fact that in the air to air look down mode, the main signal being sampled with the A/D converter is ground clutter or sea clutter which has a very narrow bandwidth and is mostly determined by the antenna beamwidth, aircraft velocity and the antenna pointing angle. A typical bandwidth will be on the order of 10 to 500 Hz. Both medium pulse repetition frequency (PRF) and high PRF waveforms are typically between 5 KHz and 300 KHz. In the case of medium PRF, the range and velocity are ambiguous and, in the case of high PRF, the range is ambiguous and the velocity is not ambiguous. This greatly over-samples the clutter by a factor of 10 and, more typically, by a factor of 100, so from PRI to PRI for a single range bin, the signal value will not change much between PRIs. Two example algorithms for determining the error term would be: (1) the error term being the difference between the magnitude of the data out of the A/D converter and a reference level and (2) if the signal level is within 2 dB of the top of the maximum value of the A/D conversion, then one dB of attenuation is added to the next PRI. With the latter approach, the circuitry chooses the amount of hysteresis that is placed into this function, maintaining a small amount of head room at the top of the A/D converter dynamic range of, for example, 3 dB or less, so that typically, pulse to pulse, there will be very little if any change in the attenuation values. As the output of the attenuator drifts close to the top of the A/D converter handling capacity, short of saturation, a few dB or less would be added to the attenuator setting. On the other hand, if the signal drops down so that it is below the desired "head room", then attenuation is removed.

Depending upon the system scenario, the automatic gain control (AGC) could be close to settling out by the time signals are received from maximum range. In a medium pulse repetition frequency (PRF) situation, where PRF=1/PRI, several to about six pulses could be used to derive the initial setting of the A/D converter and with a high PRF waveform, 10 to 20 times that number of pulses could be used.

Following the initial setting, the above described procedure maintains a nearly constant signal level into the A/D converters. In the signal processor, it is necessary to carefully remove or reinsert the signal level to derive the signal prior to the attenuator with an inverse of the attenuator function. Errors between the attenuation applied and the inverse attenuation can degrade system dynamic range. The attenuator itself can be carefully calibrated during system dead times to insure that the system can accurately reinsert the value that was placed therein prior to the A/D in high performance systems, requiring very little added signal processing operations.

The attenuator function in this type of system is very critical, it being necessary that it settle out or reach the desired attenuation value well within the range bin interval. The desire is for the attenuation to settle within one tenth of a range bin interval. The timing on this is implemented as in synchronous logic when the A/D converter sample is taken from one range bin, changing the attenuation for the next range bin. This provides maximum settling time before the A/D window opens to take the sample for the following range bin. There are several ways to implement the fast attenuator, one being to use a doubly balanced mixer with a current control circuit going in the IF port of the mixer. This is a simple approach and works well with bandwidths up to 5 to 10 MHz with IFs as low as 100 MHz, but the approach in the first IF or the second IF gaining isolation through the down conversion process. Also, a circuit comprising pin diode switches and fixed resistive attenuators can be implemented with very fast switching times and very fast settling times and very accurate pulse-to pulse repeatability. Such circuitry implemented at any of the IFs will easily be adequate for bandwidths up to 10 MHz.

With typical A/D converters, the subject system will maintain the maximum spurious free dynamic range that is specified for that A/D converter. Since the best spurious free dynamic range is very close to the maximum signal value, maximum performance is obtained when operating near saturation signal levels in A/D converters.

DESCRIPTION OF THE PREFERRED EMBODIMENT

Figure 1:
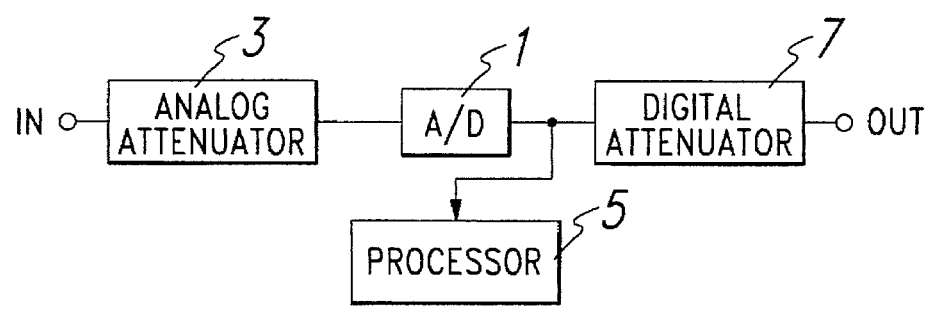
FIG. 1 is a block diagram of a circuit in accordance with the present invention.

Referring first to FIG. 1, there is shown a general block diagram of a system in accordance with the present invention. The system is shown to include an A/D converter which has an optimum signal operating level which is close to the saturation level thereof. Analog input signals are received from an external source, such as, for example, an antenna and are fed through an analog variable attenuator 3 of known type, the attenuation level thereof being set by a processor 5 in standard manner. The analog input signals are attenuated by the analog attenuator 3 in accordance with the attenuation level set by the processor 5 and converted to digital signals in the A/D converter 1. The digital output of the A/D converter 1 is attenuated by the digital variable attenuator 7, the attenuation level of which is preset by the processor 5 to be the inverse of the attenuation level provided at the analog attenuator 3 so that the output signal has the same dynamic level as that of the input signal except that it is now in digital form. The processor 5 constantly monitors the dynamic level of the A/D converter 1 output via the monitor conductor 9 and adjusts the attenuation level of the analog attenuator 3 so that A/D converter 1 operates as close as possible to its optimal operating point. The processor 5 concurrently adjusts the attenuation level of the digital attenuator 7 so that the total attenuation from input to output is cancelled with the dynamic level of the output signal being substantially the same as at the input terminal. In this way, the input data is sampled from range bin to range bin (A/D converter output samples) to compensate for changes in dynamic level of the input signal and maintain operation as close as possible to the optimal operating level of the A/D converter 1.

Figure 2:
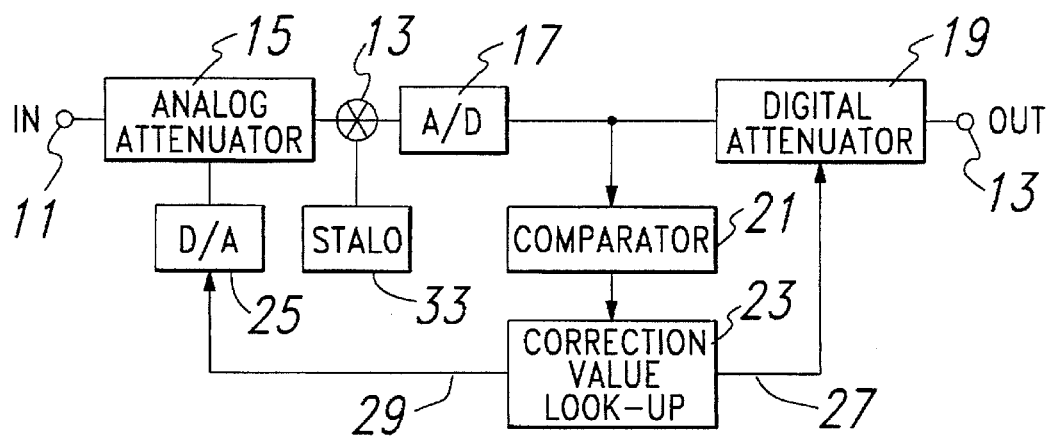
FIG. 2 is a more detailed block diagram of a circuit in accordance with the present invention.

Referring now to FIG. 2, there is shown the circuit of FIG. 1 in greater detail. The circuit includes an analog input 11 which can be received, for example, from a radar antenna, focal plane array, etc. The analog signal is attenuated in the analog attenuator 15 which is initially preset to a predetermined attenuation level. The output of the attenuator 15 is passed through a mixer 31 controlled by a stabilized local oscillator 33. The output of the mixer 31 is digitized by an analog to digital converter 17 and the digital output thereof is attenuated by the digital attenuator 19 and sent to the output terminal 13, the attenuation level of the digital attenuator being preset to be the inverse of the attenuation level of the analog attenuator. In this manner, the dynamic level of the digital output at output terminal 13 is substantially the same as the dynamic lever of the analog input at input terminal 11.

The output of the A/D converter 17 is sensed by a comparator 21 referenced to a predetermined reference input, the comparator 21 being preset to sense dynamic levels at and around the optimum operating level of the converter and above. It is the purpose of the comparator 21 to determine the operating level of the A/D converter 17 from the output signal level, whether this level is above or below the optimum operating level thereof as well as the extent of such operation above or below the optimum operating level and, from this determination, provide a signal to a correction value and look up data base 23 which provides appropriate correction signals for the attenuators 15 and 19. The purpose of the correction signals is to (1) maintain operation of the A/D converter 17 at the optimum operating level and (2) to maintain the operation of the A/D converter 17 below the saturation level.

A first output 27 of the correction value look-up circuit 23 is digital. Accordingly, the digital signals from output 27 are sent with appropriate delay (not shown) directly to the digital attenuator 19 from the correction value look-up circuit 23 to control the attenuation level thereof in accordance with the dynamic signal level at the output of the A/D converter 17. A second output 29 of the correction value look-up circuit 23, which is also digital and output with appropriate delay but is the inverse of the output 27 is converted to an analog value by the D/A converter 25, the analog output thereof then adjusting the attenuation level of the analog attenuator 15 so that the combination of the attenuation by the attenuator 15 and the attenuator 19 amounts to substantially no attenuation or an attenuation level of about 1. It should be noted that the analog attenuator 15 could have a digital input in which case the D/A converter 25 would be eliminated.

A system utilizing the above described teachings will maintain the maximum spurious free dynamic range that is specified for the A/D converter 1 or 17. Since the best spurious free dynamic range is very close to the maximum signal value, maximum performance is obtained when operating near but below saturation signals in the A/D converter.

Though the invention has been described with respect to a specific preferred embodiment thereof, many variations and modifications will become readily apparent to those skilled in the art. It is therefore the intention that the appended claims be interpreted as broadly as possible in view of the prior art to include all such variations and modifications.

I claim:

1. A receiver which comprises:
   (a) an analog to digital converter having an input terminal and an output terminal for converting an analog signal at the input terminal thereof to a corresponding digital signal at the output terminal thereof;
   (b) an analog attenuator for receiving and attenuating analog signals applied thereto, said analog attenuator coupled to the input terminal of said converter and applying attenuated analog signals to said input terminal of said converter;

(c) a digital attenuator for receiving and attenuating digital signals applied thereto, said digital attenuator coupled to the output terminal of said converter and attenuating digital signals received from said output terminal of said converter; and (d) circuitry for concurrently maintaining the combined attenuation level of said analog attenuator and said digital attenuator to about one;

(e) wherein said circuitry for maintaining includes circuitry responsive to the pulse repetition interval of signals at the input terminal of said converter to adjust the attenuation of said analog attenuator and said digital attenuator.

2. A receiver as set forth in claim 1 further including a mixer coupled between said analog attenuator and said converter.

3. A receiver as set forth in claim 2 wherein said circuitry for maintaining includes a dynamic level sensing circuit for determining when the dynamic level of the output of said converter is at a predetermined minimum level and circuitry responsive to a said determination by said dynamic level sensing circuit to provide signals to said analog attenuator and said digital attenuator to maintain the combined attenuation of said attenuators to a level of about 1.

4. A receiver as set forth in claim 1 wherein said circuitry for maintaining includes a dynamic level sensing circuit for determining when the dynamic level of the output of said converter is at a predetermined minimum level and circuitry responsive to a said determination by said dynamic level sensing circuit to provide signals to said analog attenuator and said digital attenuator to maintain the combined attenuation of said attenuators to a level of about 1.

5. A receiver which comprises:

(a) an analog to digital converter having an input terminal and an output terminal for converting an analog signal at the input terminal thereof to a corresponding digital signal at the output terminal thereof;

(b) an analog attenuator for receiving and attenuating analog signals, said analog attenuator coupled to the input terminal of said converter and applying attenuated analog signals to said input terminal of said converter;

(c) a digital attenuator for receiving and attenuating digital signals, said digital attenuator coupled to the output terminal of said converter and attenuating digital signals received from said output terminal of said converter; and (d) circuitry coupled to the output terminal of said converter for concurrently controlling the attenuation level of both said analog attenuator and said digital attenuator;

(e) wherein said circuitry for maintaining includes circuitry responsive to the pulse repetition interval of signals at the input terminal of said converter to adjust the attenuation of said analog attenuator and said digital attenuator.

6. A receiver as set forth in claim 5 further including a mixer coupled between said analog attenuator and said converter.

7. A receiver as set forth in claim 6 wherein said circuitry coupled to the output of said converter includes a dynamic level sensing circuit for determining when the dynamic level of the output of said converter is at a predetermined minimum level and circuitry responsive to a said determination by said dynamic level sensing circuit to provide signals to said analog attenuator and said digital attenuator to control the attenuation level of said analog and digital attenuators.

8. A receiver as set forth in claim 7 wherein said circuitry responsive to said determination maintains the combined attenuation of said attenuators to a level of about 1.

9. A receiver as set forth in claim 5 wherein said circuitry coupled to the output of said converter includes a dynamic level sensing circuit for determining when the dynamic level of the output of said converter is at a predetermined minimum level and circuitry responsive to a said determination by said dynamic level sensing circuit to provide signals to said analog attenuator and said digital attenuator to control the attenuation level of said analog and digital attenuators.

10. A receiver as set forth in claim 9 wherein said circuitry responsive to said determination maintains the combined attenuation of said attenuators to a level of about 1.

11. A receiver which comprises:

(a) an analog to digital converter having an input terminal and an output terminal;

(b) an analog attenuator for receiving and attenuating analog signals coupled to the input terminal of said converter;

(c) a digital attenuator for receiving and attenuating digital signals coupled to the output terminal of said converter; and (d) data base circuitry responsive to the output of said converter and responsive to a determined output level of said converter to control said attenuators in conjunction with said data base to provide a combined gain from said attenuators of about 1 while providing optimum operating levels of said converter;

(e) wherein said data base circuitry includes circuitry responsive to the pulse repetition interval of signals at the input terminal of said converter to adjust the attenuation of said analog attenuator and said digital attenuator.

12. The receiver of claim 11 wherein said data base circuitry is coupled between the output terminal of said converter and said digital attenuator.

13. The receiver of claim 11 wherein said data base circuitry includes a data base and a comparator for determining the output level of said converter coupled between the output terminal of said converter and said data base for determining the output level of said converter.

14. The receiver of claim 13 wherein said data base circuitry provides digital signals, further including a digital to analog converter coupled between said data base circuitry and said analog attenuator to convert said digital signals to analog signals.

15. The receiver of claim 12 wherein said data base circuitry provides digital signals, further including a digital to analog converter coupled between said data base circuitry and said analog attenuator to convert said digital signals to analog signals.

16. The receiver of claim 11 wherein said data base circuitry includes a data base and a comparator for determining the output level of said converter coupled between the output terminal of said converter and said data base for determining the output level of said converter.

17. The receiver of claim 16 wherein said data base circuitry provides digital signals, further including a digital to analog converter coupled between said data base circuitry and said analog attenuator to convert said digital signals to analog signals.

18. The receiver of claim 11 wherein said data base circuitry provides digital signals, further including a digital to analog converter coupled between said data base circuitry and said analog attenuator to convert said digital signals to analog signals.

* * * * *